United States Patent
Gohr et al.

(10) Patent No.: US 9,678,628 B2
(45) Date of Patent: Jun. 13, 2017

(54) METHOD FOR GENERATING CONTROL-CODE BY A CONTROL-CODE-DIAGRAM

(71) Applicant: ABB Technology AG, Zürich (CH)

(72) Inventors: Katharina Gohr, Weinheim (DE); Christian Messinger, Hirschberg (DE)

(73) Assignee: ABB Schweiz AG, Baden (CH)

( * ) Notice: Subject to any disclaimer, the term of this patent is extended or adjusted under 35 U.S.C. 154(b) by 374 days.

(21) Appl. No.: 14/333,569

(22) Filed: Jul. 17, 2014

(65) Prior Publication Data

US 2015/0026635 A1    Jan. 22, 2015

(30) Foreign Application Priority Data

Jul. 17, 2013 (EP) .................................. 13003610

(51) Int. Cl.
*G06F 3/048* (2013.01)
*G06F 3/0482* (2013.01)
(Continued)

(52) U.S. Cl.
CPC .......... *G06F 3/0482* (2013.01); *G06F 3/0484* (2013.01); *G06F 8/34* (2013.01);
(Continued)

(58) Field of Classification Search
CPC ........ G06F 3/0482; G06F 3/0484; G06F 8/34; G06F 8/36; G06F 1/03; G06F 17/50
See application file for complete search history.

(56) References Cited

U.S. PATENT DOCUMENTS 4,901,221 A * 2/1990 Kodosky ............... G06F 3/0481
  714/E11.217
5,812,394 A * 9/1998 Lewis ................ G05B 19/0426
  700/17

(Continued)

FOREIGN PATENT DOCUMENTS

WO    2006034258 A1    3/2006
WO    2007080142 A2    7/2007

OTHER PUBLICATIONS

European Search Report and Written Opinion, European Application No. 13003610.6, dated Dec. 16, 2013, 6 pages.

*Primary Examiner* — Dino Kujundzic
(74) *Attorney, Agent, or Firm* — Barnes & Thornburg LLP (57) ABSTRACT

A method for generating control-code, where at least one function-block and/or function-block-connection is specified. The method includes providing an indexed database containing data of at least part of an existing control-diagram with function-blocks and function block-connections; displaying a diagram-entry-field for specifying the control-diagram by defining the at least one function-block and/or the function block-connection and receiving a user input thereof; comparing received user input with the data of the indexed database to identify at least one similar part of the at least one control-diagram; displaying an assisting-menu with the at least one similar part of the at least one control-diagram; receiving an acceptance or rejection of the at least one similar part of the at least one control-diagram; inserting, in case of acceptance, the at least one similar part of the at least one control-diagram from the indexed database in the diagram-entry-field; and translating the completed control-diagram in the control-code.

14 Claims, 4 Drawing Sheets

(51) Int. Cl.
*G06F 3/0484* (2013.01)
*G06F 17/50* (2006.01)
*G06F 9/44* (2006.01)

(52) U.S. Cl.
CPC .................. *G06F 8/36* (2013.01); *G06F 8/33* (2013.01); *G06F 17/50* (2013.01)

(56) References Cited

U.S. PATENT DOCUMENTS

| | | | | |
|---|---|---|---|---|
| 6,173,208 B1 * | 1/2001 | Park | ..................... | G05B 19/056 700/18 |
| 6,305,008 B1 * | 10/2001 | Vaidyanathan | ........... | G06F 8/33 707/999.104 |
| 7,340,683 B2 * | 3/2008 | Ueda | .................... | G05B 19/056 715/763 |
| 2002/0178434 A1 * | 11/2002 | Fox | ........................... | G06F 8/70 717/106 |
| 2003/0101023 A1 * | 5/2003 | Shah | ................... | G06F 9/44505 702/186 |
| 2007/0106633 A1 * | 5/2007 | Reiner | ................... | G06F 19/321 |
| 2007/0168946 A1 * | 7/2007 | Drissi | ....................... | G06F 8/71 717/110 |
| 2008/0072210 A1 * | 3/2008 | Rush | ......................... | G06F 8/33 717/121 |
| 2008/0205092 A1 * | 8/2008 | Sokuza | ................... | H02P 29/00 363/34 |
| 2009/0259986 A1 * | 10/2009 | Bui | .......................... | G06F 8/36 717/104 |
| 2009/0327942 A1 * | 12/2009 | Eldridge | ................... | G06F 8/34 715/771 |
| 2010/0106705 A1 * | 4/2010 | Rush | ......................... | G06F 8/36 707/709 |
| 2010/0192128 A1 * | 7/2010 | Schloegel | ........... | G06F 11/3684 717/125 |
| 2012/0078869 A1 * | 3/2012 | Bellville | ........... | G06F 17/30943 707/706 |

* cited by examiner

METHOD FOR GENERATING CONTROL-CODE BY A CONTROL-CODE-DIAGRAM

RELATED APPLICATION

This application claims priority under 35 U.S.C. §119 to European Patent Application No. 13003610.6 filed in Europe on Jul. 17, 2013, the entire content of which is hereby incorporated by reference in its entirety.

FIELD

The present disclosure relates to a method for generating control-code by specifying a control-diagram with function-blocks and function-block-connections.

BACKGROUND INFORMATION

Control-code-diagrams are also referred to as function-block-diagrams (FBD). They are user-created diagrams of application logic, and include interconnected graphical blocks that represent functions or logic.

In system- and software-engineering, these diagrams are used to describe the function of a technical system and the interrelationships between different systems. Engineers generate control-code by specifying control-code-diagrams. A control-code-diagram is a graphical language, exemplary for programmable logic controller design. The main elements of these diagrams are function-blocks and connections thereof. Function-blocks basically describe the function between input and output variables. Each connection line carries associated data from output ports to input ports of function-blocks or vice versa. Divergent connections are also available to broadcast information. To conclude, a control-code-diagram is a multi-tier, time sequenced, step-by-step flow diagram of a functional flow of any system.

These diagrams may contain the following key attributes: (i) function-blocks including a function which stands for a definite, finite, discrete action; and (ii) function-block-connections, which define the relationships between the function-blocks by connecting the input and output elements thereof.

A user may generate a control-code-diagram basically by performing the following steps: (i) in a first step, function-blocks are created in the model surface; (ii) in a second step, the function-blocks are wired by connecting the input and output ports of the function-blocks; and (iii) in a third step, parameters are used to configure the function-blocks according to the simulation.

After the user finishes the generation of the control-code-diagram, a simulation could be run directly in the control-code-diagram. In this case, scope blocks are usually specified in order to see and evaluate the simulated result.

Another way is to translate the control-code-diagram to control-code. The control-code can be used for a wide range of real-time and non-real-time applications, exemplary simulation acceleration, rapid prototyping or hardware-in-the-loop testing. The control-code might be used also to run on a controller or on a programmable logic controller (PLC).

Furthermore, indexed databases are known. An indexed database may include an index structure, which is separate from the data structure. By using an indexed database, the required time for searching and filtering the data is decreased. Indices consist of pointers, which define an order relation and a quick look-up access to one or several columns of the database.

However, there are drawbacks in known techniques. When specifying control-diagrams, the user does not get any suggestion on how to proceed with it. In case the user decides to adapt an existing control-diagram, the user has to notice that a similar control-diagram exists. This may be a problem for engineers who are new in a project, or for engineers who join an ongoing project. These engineers usually do not have the knowledge where to find similar existing control-diagrams, or do not even know where to search for it.

SUMMARY

An exemplary embodiment of the present disclosure provides a computer-implemented method for generating control-code by in which at least one processor of a computer is executing a computer program, wherein a control-diagram with at least one of a function-block and function-block-connection is specified. The exemplary method includes: providing an indexed database containing data of at least part of at least one existing control-diagram with function-blocks and function block-connections; displaying, by the at least one processor, a diagram-entry-field on a graphical-device for specifying the control-diagram by defining the at least one of the function-block and the function block-connection via user input; receiving, by the at least one processor, user input of the at least one of the function-block and the function block-connection; comparing, by the at least one processor, responsive to the receiving, recently received user input with the data of the indexed database to identify at least one similar part of the at least one control-diagram; displaying, by the at least one processor, an assisting-menu on the graphical-device with the at least one similar part of the at least one control-diagram; receiving, by the at least one processor, an acceptance or rejection of the at least one similar part of the at least one control-diagram via user input; in case of acceptance, inserting, by the at least one processor, the at least one similar part of the at least one control-diagram from the indexed database in the diagram-entry-field; and translating, by the at least one processor, the completed control-diagram in the control-code.

An exemplary embodiment of the present disclosure provides a non-transitory computer-readable recording medium having a computer program recorded thereon that causes at least one hardware processor of a computer processing device to execute a method of generating control-code, wherein a control-diagram with at least one of a function-block and function-block-connection is specified. The method includes accessing an indexed database containing data of at least part of at least one existing control-diagram with function-blocks and function block-connections; displaying a diagram-entry-field on a graphical-device for specifying the control-diagram by defining the at least one of the function-block and the function block-connection via user input; receiving user input of the at least one of the function-block and the function block-connection; comparing responsive to the receiving, recently received user input with the data of the indexed database to identify at least one similar part of the at least one control-diagram; displaying an assisting-menu on the graphical-device with the at least one similar part of the at least one control-diagram; receiving an acceptance or rejection of the at least one similar part of the at least one control-diagram via user input; in case of acceptance, inserting the at least one similar part of the at least one control-diagram from the indexed database in the diagram-entry-field by the; and translating, by the at least one processor, the completed control-diagram in the control-code.

BRIEF DESCRIPTION OF DRAWINGS

Additional refinements, advantages and features of the present disclosure are described in more detail below with reference to exemplary embodiments illustrated in the drawings, in which.

DETAILED DESCRIPTION

Exemplary embodiments of the present disclosure provide a method of improving the generation of control-code by a control-code-diagram.

As used herein, the term "computer" means a computer processing device including at least one processor (i.e., hardware processor circuitry), a non-transitory computer-readable recording medium which is a non-volatile memory (e.g., ROM, hard disk drive, flash memory, optical memory, etc.) for tangibly storing a computer program thereon that, when executed by the at least one processor, causes the processor to execute the operative instructions contained in the program, and at least one working memory (e.g., RAM) which is used by the at least one processor and non-transitory computer-readable recording medium for carrying out the features of the computer. The computer may include and/or be communicatively connected to other components such as a display device (e.g., graphical device), and one or more input components, such as a keyboard, trackpad, and/or mouse. The display device may be a touch-screen device on which is provided the functions of a keyboard and/or mouse. The processor may be a general purpose processor or an application-specific processor constructed to carry out the operative functions described herein. Accordingly, it is to be understood that in the description of the method of the present disclosure, the operative features of the method are performed by the at least one processor of the computer executing at least one computer program tangibly recorded on a non-transitory computer-readable recording medium to carry out the operative features of the method as described herein. Exemplary embodiments of the present disclosure also provide a non-transitory computer-readable recording medium having a computer program recorded thereon that, when executed by at least one processor of a computer, cause the at least one processor to carry out the operative features of the method as described herein.

Exemplary embodiments according to the present disclosure provide a computer-implemented method for generating control-code in which at least one processor of a computer is executing a computer program, wherein a control-diagram with at least one function-block and/or function-block-connection is specified. The exemplary method includes the following steps: a) providing at least one indexed database containing data of at least part of at least one existing control-diagram with function-blocks and function block-connections; b) displaying a diagram-entry-field on a graphical-device for specifying the control-diagram by defining the at least one function-block and/or the function block-connection via user input and receiving the user input thereof; c) comparing, responsive to the receiving of the at least one function-block and/or the function block-connection via user input, at least the recently received user input with the data of the at least one indexed database to identify at least one similar part of the at least one control-diagram; d) displaying an assisting-menu on the graphical-device with the at least one similar part of the at least one control-diagram; e) receiving an acceptance or rejection of the at least one similar part of the at least one control-diagram via user input; f) inserting, in case of acceptance, the at least one similar part of the at least one control-diagram from the at least one indexed database in the diagram-entry-field; and g) translating the completed control-diagram in the control-code. The above-described steps are performed by the at least one processor of the computer.

To simplify the following description, the term "control-diagram by defining the at least one function-block and/or the function block-connection via user input" is mostly referred to as a "new diagram". The term "at least one similar part of the at least one control-diagram" is partly referred to as a "similar control-diagram". Furthermore the term "at least one indexed database" is mostly referred to as a "database"

In contrast to known techniques, a user is assisted in specifying the new control-diagram in the method of the present disclosure. After the user has started creating a new diagram, the user automatically receives suggestions concerning existing control-diagrams which complete, or at least contribute to the new control-diagram. Hence, the user does not need to manually search the database for a similar control-diagram any more. This results in a faster and more convenient creation of new control-diagrams and therefore in faster configuration of the control-code.

One way of providing the at least one indexed database is to index existing control-diagrams with the type names of the existing function-blocks manually. This is advantageous as the existing control-diagrams are usually similar to the new control-diagrams and therefore many parts can be reasonably reused. The indexing is done, for example, in order to be able to filter them in a fast way. It is only necessary to index the important control-diagrams or the important parts thereof. Also, existing indexed database libraries with templates might be used as indexed databases.

The diagram-entry-field is displayed on the graphical-device for specifying the control-diagram by defining the at least one function-block and/or the function block-connection via user input and receiving the user input thereof. After the user has finished specifying the new control-diagram, it is used for generating control-code. Function-blocks can be defined, for example, as: Derivative-, Integrator-, PID-Controller-, Transfer-Function- or Transport-Delay-Function-blocks. Function-Blocks also exist to represent or control electrical- or mechanical devices, such as motors or valves. Furthermore function-blocks for analyzing and/or viewing the simulation results can be specified. For simulation, input values of the function blocks can be set manually, and output values or other following values are then calculated and displayed next to the respective input or output port of the connected function block.

Responsive to the receiving step, at least the recently received user input is compared with the data of the indexed database to identify at least one similar part of the at least one control-diagram. Therefore, after receiving new user input, at least the new received user input is always compared repeatedly with the data of the indexed database, for example, with a defined library. When the user is specifying the new control-diagram progressively in more detail, the method of the present disclosure is capable of identifying progressively an adequate similar control-diagram. Thus, the at least one similar part of the at least one control-diagram might be a similar function-block, a similar function-block-connection or even a similar function-block-diagram. The stated artifacts do not need to be entirely equal, but at least a similarity is required.

According to an exemplary embodiment, the method of the present disclosure can also include displaying an assisting-menu on the graphical-device, which is displaying the at least one similar part of the at least one control-diagram after finding it. A first possibility is to display the assisting-menu adjacent to the diagram-entry-field on the graphical-device. Thus, the user can easily compare the identified similar control-diagram with the specified new control-diagram. Hence, the user can decide himself if the similar control-diagram displayed in the assisting-menu is fitting in a sufficient way or not. Even in case that no sufficiently fitting control-diagram is suggested, the user is influenced by=several similar control-diagrams from the database.

Depending on the decision of the user, the processor of the computer receives via user input an acceptance or rejection of the similar control-diagram. According to an exemplary embodiment, in case the user rejects the similar control-diagram, it may not be displayed again. In another exemplary embodiment, the priority could be set less so it is displayed further back in the list again. A further possible answer from the user is not to react immediately and wait until a more similar control-diagram is displayed in the assisting-menu, without rejecting the already displayed ones. In case the user accepts the similar control-diagram suggested by the method of the present disclosure, it is inserted automatically. Inserting of the similar control-diagram means that the similar control-diagram overwrites the new control-diagram.

In a last step, the completed control-diagram is automatically translated in the control-code by the at least one processor of the computer. First of all, the user decides manually that the control-diagram is finished and triggers the automatic translation to control-code.

An advantage of the method of the present disclosure is that new control-diagrams can be specified faster and simpler which results in a faster generation of control-code. Besides, the consistency of the created control-diagrams is increased as already existing diagrams are, at least partly, reused.

The method of the present disclosure is particularly advantageous when comparing the new diagram with the existing control-diagram of the database is laboriously due to a large number of existing control-diagram. This is especially the case when large-scale databases or several single databases have to be searched. The comparison is also manually burdensome, when very complex new diagrams have to be compared. An advantage of the present disclosure is therefore similarity detection and pattern recognition in order to suggest fitting similar control-diagrams, or at least parts thereof, while the user is editing the new diagram.

According to an exemplary embodiment of the present disclosure, the similarity of the at least one similar part of the at least one control-diagram is identified by the following steps: (i) translating the received user input into indices according to the structure of the at least one indexed database; (ii) comparing, at least in part, the indices of the user-input with the indices of the data of the at least one indexed database and filtering the data thereby; and (iii) determining the similarity according to the filtered data.

The received user input is translated into indices and then compared automatically with the indices of the data of the indexed database. Thus, the required time for searching and filtering is advantageously decreased by using an indexed database.

In accordance with an exemplary embodiment of the present disclosure, at least one not similar subpart of the identified at least one similar part of the at least one control-diagram is excluded from insertion. The term "at least one similar part" refers to a matching of many, but not necessarily all elements of the control-diagram. The not similar subpart is determined by comparing the indices and thereby determining the not similar indices. Therefore, the user can accept the at least one similar part of the at least one control-diagram, without the need for searching manually for a not similar subpart. Hence, the user can be sure that the already determined elements of the new control-diagram are not amended when he accepts and inserts a similar control-diagram.

In accordance with an exemplary embodiment of the present disclosure, the indices of the user-input are only compared with a restricted group of indices of the indexed database. As the group of indices of the at least one indexed database is restricted, a smaller amount of data has to be compared and therefore the comparing requires less time. The group of indices can be predefined by default (e.g., in the computer-program) or restricted manually by the user. In case several single databases are provided, the user can restrict the search to a single database. Furthermore, the user can restrict the search category. In this case, the method is restricted to identify only similar control-diagrams, only similar function-blocks, and/or only similar function-block-connections. The comparison and therefore the results of the method of the present disclosure are adaptable to the needs of the user. Therefore, it is also possible to exclude irrelevant data from the comparison, for example, certain function-blocks such as IO-blocks or glue logic. This results advantageously in more accurate results. The comparison can also be limited to file names or special folders. Further, the comparison can be restricted to other data structures as not all the relevant data might necessarily be split up into different files. For example, the data can be stored in a relational database or as data contained in content, for example, BLOBs. Hence, the comparison only with a restricted group of indices of the indexed database results in a faster and therefore more convenient search.

According to an exemplary embodiment of the present disclosure, the method may also include determining a similarity-value for the at least one similar part of the at least one control-diagram and assigning it thereto.

Hence, the at least one similar part of the at least one control-diagram is evaluated by the assigned similarity-value, which gives a statement on how similar the similar control-diagram is compared to the new diagram. The similarity depends, for example, on how many function-blocks, how many function-block-connections or how many parameters of the function-blocks are identical.

In accordance with an exemplary embodiment of the present disclosure, the similarity-value is respectively defined and/or determined such that it is increasing according to an increasing number of same values of indices of the user-input compared to the indices of the identified at least one similar part of the at least one control-diagram. Therefore, the similarity-value defines a hierarchical order of similar control-diagram. The hierarchical order might be used to determine the order in which the similar control-diagram is displayed on the assisting-menu. In case all indices of the user-input are identical to the indices of the similar control-diagram, the similarity-value has the highest value.

In accordance with an exemplary embodiment of the present disclosure, the indices of the user-input and/or the indices of the identified at least one similar part of the at least one control-diagram are weighted when determining a similarity-value. Hence, by weighting the indices, their importance is also considered. Function-blocks are weighted depending on the kind of function-blocks, for example, function-blocks representing process equipment are higher weighted than function-blocks used for glue logic (e.g. and/or-logic). The weighting parameters may be predefined by default, but can also be adapted manually to the needs of the user. If required, a user can adapt the indices in a way that complete similar diagrams are higher weighted than only similar part of the similar control-diagram. Therefore, the user may receive complete similar diagrams on the assisting-menu instead of similar function-blocks or similar function-block-connection.

According to an exemplary embodiment of the present disclosure, only at least one similar part of the at least one control-diagram with a similarity-value equal or higher than a minimum similarity-level is displayed. The similarity level might be defined in that way that the user receives sufficient choice of similar control-diagrams, and the user is, for example, not overcrowded with similar control-diagrams which are too different from the new control-diagram. The similarity-level may adapt automatically to the identified similar control-diagrams. In case only very few similar control-diagrams are identified, the similarity-level might be decreased so that the user receives at least some similar control-diagrams. In case many similar control-diagrams are identified, the similarity-level is automatically increased. The similarity-level might also be controllable manually by the user. Alternatively, a fixed number of similar control-diagrams may be provided. For example, a maximum number of five or ten similar diagrams are only proposed, wherein the number of proposed diagrams is manually configurable. If less similar control-diagrams are found, all of them are displayed.

According to an exemplary embodiment of the present disclosure, the method may include the following steps: (i) defining at least one identical-effect-group of at least part of at least one existing control-diagram with identical technical effect; (ii) determining for each identical-effect-group a preferred data, respectively, a preferred solution; and (iii) in case of identifying at least one similar part of the at least one control-diagram in an identical-effect-group displaying at least the respective preferred data.

The identical-effect-group contains a collection of at least parts of at least one existing control-diagram with identical technical effect. Therefore, the technical effect of the existing control-diagrams is identical, but the existing control-diagrams are configured differently. The existing control-diagrams of the identical-effect-group are also referred to as naïve solutions. For each identical-effect-group, the preferred data are determined manually. For instance, the new control-diagram could be simplified, unnecessary complications could be minimized and common pitfalls are avoided. This leads to a better control code and also to a more consistent control code between different users.

In accordance with an exemplary embodiment of the present disclosure, the option to select in-between the identified several similar control-diagrams is provided, in case of identifying several similar parts of several control-diagrams. Therefore, the user is enabled to select between several identified similar control diagrams. The user can reject some of the displayed control-diagram, wherein the not-rejected control-diagrams are moving automatically upward, for example, according to the determined hierarchical order.

According to an exemplary embodiment of the present disclosure, the graphical-device is configured as a touch pad. By configuring the graphical-device as a touch pad, the graphical-device and an input device are advantageously combined. Therefore, a keyboard or a computer mouse as input device becomes obsolete.

Figure 1:
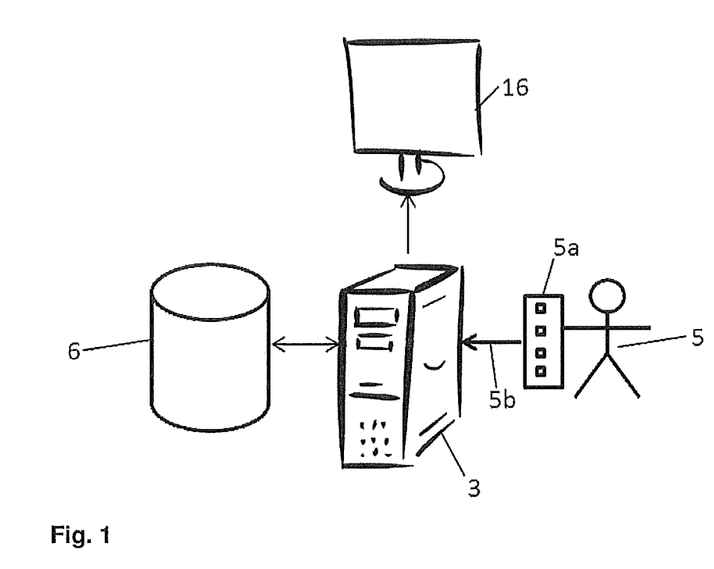
FIG. 1 shows an exemplary computer for performing the method according to the present disclosure.

FIG. 1 shows an exemplary embodiment of a computer 3 for performing the method according to the present disclosure. The computer 3 is connected to an input device 5a, to an indexed database 6 and to a graphical device 16. The user 5 specifies his user input 5b via an input device 5a, for example, a keyboard and/or a computer mouse. The user input 5b is processed by the computer 3 and may be compared with data of the indexed database 6. The graphical display 16 is exemplary used for displaying a diagram-entry-field and an assisting-menu. Not depicted in the figure is, that the graphical display 16 can be configured as a touch pad. It is also not depicted, that the devices can be exemplary provided in a computing cloud, instead of being provided physically. In this case, the shown computer 3 can be replaced by a distributed computer network which may include several single distributed databases. Furthermore, the indexed database 6 can exemplary only exist in a main memory of the computer, which makes the physical storage obsolete.

Figure 2:
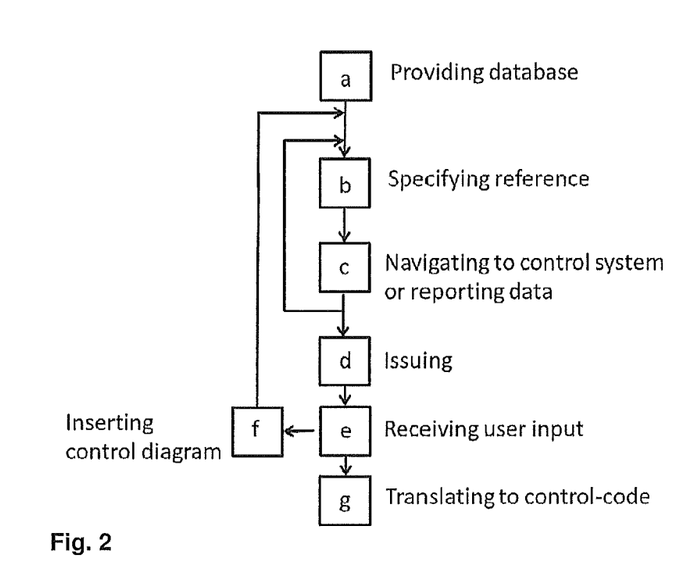
FIG. 2 shows a block diagram illustrating the steps according to an exemplary embodiment of the method of the present disclosure.

FIG. 2 is an exemplary block diagram illustrating the steps according to the present disclosure. In a first step "a," at least one indexed database containing data of at least parts of at least one existing control-diagram with function-blocks and function block-connections is provided. The term "at least one indexed database" means that one or several indexed databases could be used to provide the data. All existing control-diagrams, or only subsets thereof are indexed with the type names of the contained function-blocks. Control-modules, which may be constituted by several connected function-blocks, or by structured text, can be also indexed. According to an exemplary embodiment, the indexing is only necessary once per diagram in order to be able to filter them in a fast way. Not all existing control-diagrams and not all parts thereof need to be indexed as some do not provide important features. For example, function blocks representing IO-variables or other variables may not relevant to find in the appropriate function-block-diagram and are therefore not included in the index. Whereas the type of a function block representing a hardware sensor or an actuator is relevant as well as glue logic like AND/OR/NOT and may be indexed.

In a second step "b," the control-diagram is specified by defining the at least one function-block and/or the function block-connection via user input. The control-diagram may be specified in a diagram-entry-field which is displayed on a graphical-device. In this step, the user may generate the diagram progressively. The diagram is generated by inserting function-blocks and furthermore wiring the input and output ports with function-block-connections. Furthermore, the parameters of the function-blocks are defined.

In a third step "c," at least the recently received user input is compared with the data of the at least one indexed database to identify at least one similar part of the at least one control-diagram. Responsive to receiving user input, this third step "c" is repeated. Therefore the third step "c" may be repeated after defining a further at least one function-block and/or the function block-connection via user input and receiving the user input thereof. This is indicated by the depicted upward arrow, which begins between step "c" and "d" and ends between the steps "a" and "b". The sequence may be executed in the background, while the user edits the new control-diagram. According to an exemplary embodiment, after editing the new control-diagram, the data is always compared by the indexing according to the types used in the diagram. The program checks if the existing control-diagram contains all the types, or at least all the main types, the user already added to his new diagram. The term "main types" refers, for example, to a sensor, valve or a motor, but not necessarily all the glue logic must be contained. Connections between ports of function blocks that exist in the existing diagrams are searched for, as well as in the new control-diagram. For function blocks like AND and OR, it may not be relevant which input port is used, as the ports are equivalent.

According to an exemplary embodiment, each diagram can be evaluated with a similarity-value which gives a statement on how similar the existing diagram is to the new diagram. For example, the similarity may depend on how many connections are the same, on the number of identical function-blocks, and/or on the number of identical parameter values. Furthermore, the similarity value could be charged with a factor for the same or similar context or history.

In a fourth step "d," an assisting-menu may be displayed on the graphical-device. The assisting menu displays the at least one similar part of the at least one control-diagram. As the assisting-menu may be displayed adjacent to the entry field, the user is enabled to compare the suggested similar control-diagram with the already specified control-diagram. Hence, a list of fitting diagrams can be suggested to the user in the assisting-menu. The list may be sorted according to the similarity-value. The similarity-value can depend on further factors, for example. The presentation of the list to the user should be in a graphical format, wherein previews of the fitting diagrams can be shown exemplary. In case of several identical diagrams, the redundant diagrams should be only listed once.

In a fifth step "e", the method receives an acceptance or rejection of the at least one similar part of the at least one control-diagram via user input. In case the user rejects, the similar part of the at least one control-diagram is not inserted. Nevertheless, it can be suggested again to the user as it might fit better for another diagram.

In case the user accepts, in the sixth step "f," the at least one similar part of the at least one control-diagram is inserted from the at least one indexed database in the diagram-entry-field by the processor. Only the delta (i.e., the difference) may be added so that no configuration, for example, parameter values of existing function blocks, are overwritten. It is also possible that the accepted similar control-diagram overwrites the new diagram.

It should be possible to undo the insertion of the inserted diagram if the user notices that it was not the right one. In addition or as an alternative, the user can also navigate from the presented preview on the assisting-menu directly to the diagram, to take a deeper look at it, before inserting it. It might be also possible to navigate back to the new diagram quickly. Also, a preview of the new inserted diagram could be possible. In this case, for example, the user would not take it over instead of doing an undo afterwards.

The second upward arrow, which begins after the seventh step "f" and ends between the first step "a" and the second step "b" indicates, that always after inserting similar control-diagram in the diagram-entry-field the user can specify further control-diagrams.

In the seventh step "g", the completed control-diagram is translated in the control-code by the processor executing the computer-program. The generated control-code might be ANSI/ISO, C– or C++ code or any code according to the IEC 61131-3 standard for programmable controllers. The incremental code generation for large function-block models and the integer-, floating-point and fixed-point data type generation may be supported. Furthermore, the code generation of single-rate, multi-rate and asynchronously executed function-diagrams might be supported. Additionally, the singletasking, multitasking and the multi-core execution with or without RTOS can be provided. The parameter adaption and the signal monitoring of the already translated code can be furthermore enabled.

Figure 3:
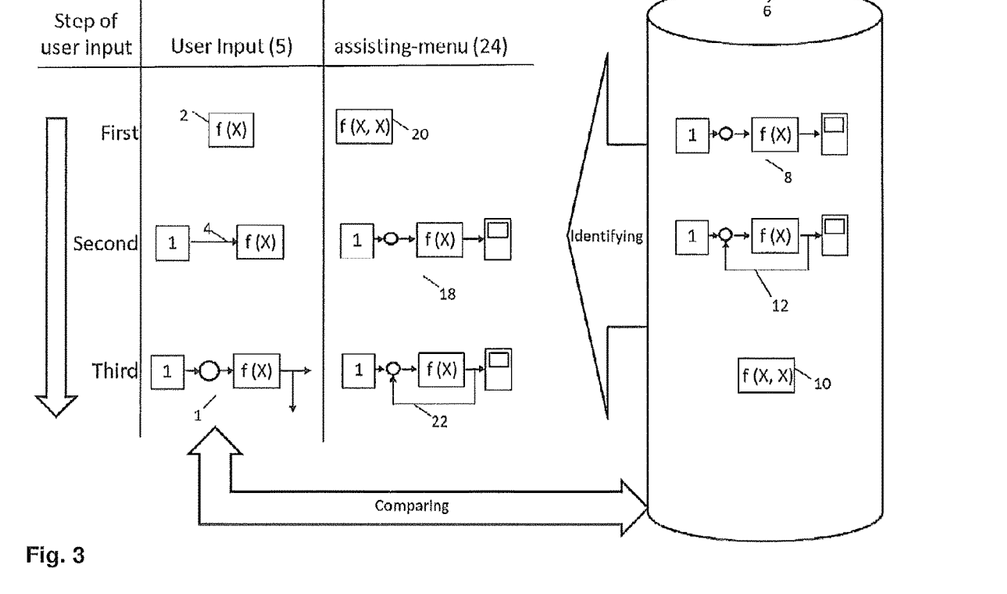
FIG. 3 is an exemplary sequence diagram.

FIG. 3 depicts an exemplary sequence diagram. On the left side, an arrow with three exemplary user input steps is shown. The user input 5 is not limited to three steps and contains usually more steps.

In a first exemplary step, a function-block 2 is specified by user input 5. It is not depicted that the processor translates the received user input 5 into indices and compares the indices with the indices of the data of the indexed database 6. The indexed database 6 contains exemplary an existing function-block 10, an existing function-block-connection 12 and an existing control-diagram 8.

By comparing, the method identifies the existing function-block 10 as a similar function-block 20, which is then displayed on the assisting-menu 24. In this example, the user ignores the displayed similar function-block 20 which contains a transfer function which depends on two parameters and is therefore not similar to his specified function-block 2. After this the user specifies a second step.

In the exemplary second step, the user specifies a further function-block and a function-block-connection 4 between the previously specified function-blocks. The further function-block has a constant input value. In response to the user input 5 of the second step, the method again compares the new control-diagram with the content of the indexed database 6 and identifies the existing control-diagram 8 as a similar control-diagram 18. The similar control-diagram 18 is, in response to the identification, displayed on the assisting-menu 24. Compared to the new diagram, the similar control-diagram 18, suggested on the assisting-menu 24, additionally includes a scope.

In an exemplary third step, the user specifies a control-diagram 1, wherein the depicted outgoing function-block-connection has another branching function-block-connection. In response to the received user input 5, the method identifies an existing control-diagram 8 with an existing function-block-connection 12. It is then displayed in the assisting-menu 24 as the similar control-diagram with a similar function-block-connection 22.

The comparing of the new user input is depicted by the lower horizontal arrow. This procedure is repeated until the user completely finishes the new control-diagram 1.

Figure 4:
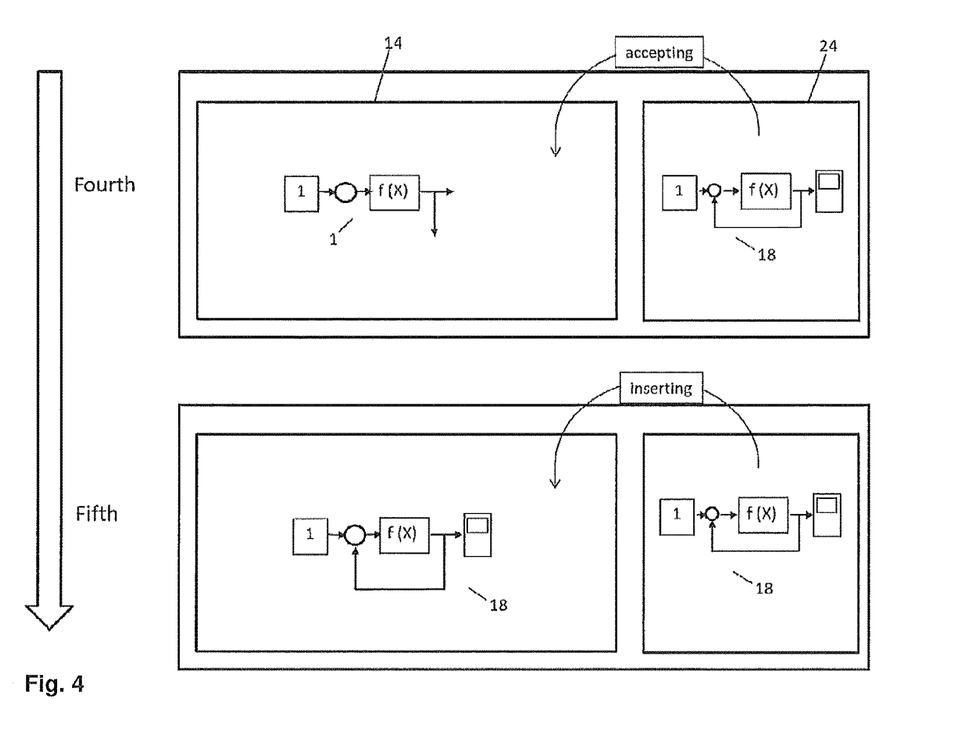
FIG. 4 is an exemplary insertion of an exemplary control-diagram.

FIG. 4 shows an exemplary insertion of the exemplary control-diagram 1. This is depicted by two further steps of user input, step four and five. These steps are an exemplary continuation of the preceding first, second and third step of FIG. 3. In the exemplary fourth step, the user accepts the similar control-diagram 18, which is displayed on the assisting-menu 24. This is schematically depicted by the "accepting arrow." In the fifth step, the accepted similar control-diagram 18 may be inserted in the diagram-entry-field 14. The control-diagram 1 is complemented by the accepted similar control-diagram 18. Due to the exemplary completion, the user advantageously does not need to specify the scope and the lower function-block-connection himself.

According to an exemplary embodiment, the similar control-diagram 18 can be inserted besides the new control-diagram instead of complementing it. Therefore, the user has to complement the delta between both diagrams himself by drag- and drop. This can be advantageous, as the user can decide consciously which parts he wants to copy. Nevertheless, in case of complex control-diagrams, the exemplary described drag- and-drop-method becomes very laborious.

According to an exemplary embodiment of the method, the similar control-diagram overwrites the new control-diagram. This is advantageous when the new control-diagram and the similar control-diagram have the same technical effect, but the similar control-diagram is structured in a better way. In this case, the method may guarantee that the similar control-diagrams are defined in the same way as the new control-diagrams, independent of the user.

It is common in use for function-modules that group several function-blocks 2 and several function-block-connections 4 together. Also, sub-function-blocks which constitute a control-diagram are known. Hence, the method of the present disclosure is also able to identify sub-function-blocks and function-modules. Therefore, function-modules and sub-function-blocks can be also compared, identified and displayed on the assisting-menu.

Figure 5:
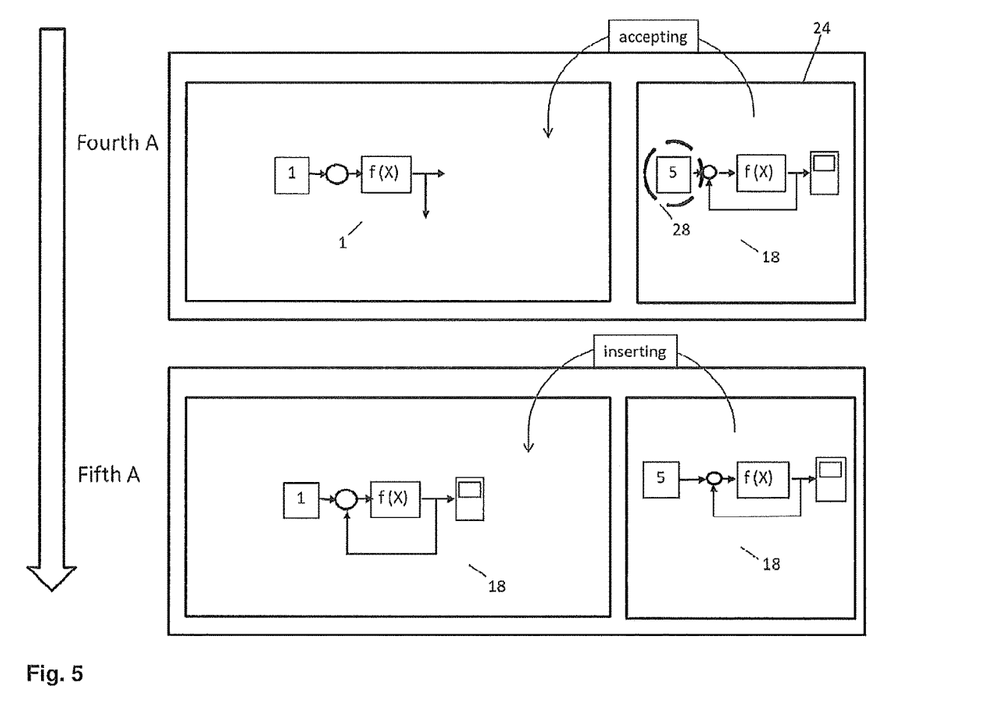
FIG. 5 is an exemplary further insertion of an exemplary control-diagram.

FIG. 5 differs from FIG. 4 in that the input parameter of the similar control-diagram 18 is not consistent any more with the input parameter of the new control-diagram. Therefore, the new control-diagram 1 is not fully covered any more by the similar control-diagram 18. To indicate this change, the steps are marked with an A, which results in step fourth A and step fifth A.

To gain the users attention of this change, the different input parameter is, for example, indicated as a not similar-subpart 28. The not similar-subpart 28 is then excluded from insertion. In case of insertion, the new control-diagram 1 remains therefore as exemplary specified by the user. This is especially advantageous, in case of very complex control-diagram, in which several single subparts may be different from the new control-diagram and therefore the user cannot control it manually any more.

Figure 6:
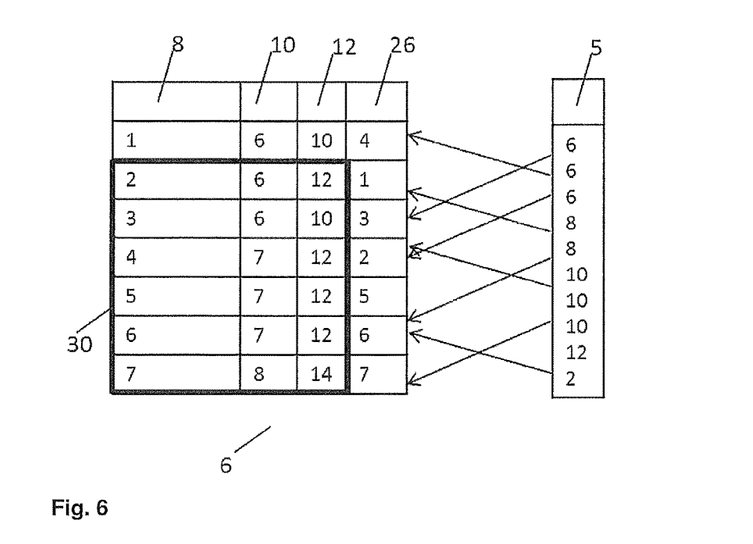
FIG. 6 is an exemplary scheme of an indexed database.

FIG. 6 depicts an exemplary indexed database 6. The indexed database 6 may contain existing control-diagrams 8, existing function-blocks 10 and existing function-block-connections 12. The exemplary received user-input 5 is shown in the exemplary received order and translated into indices.

The depicted indices include pointers, which define an exemplary order-relation to the indexed database 6. The received user input 5 is translated into indices according to the structure of the indexed database 6 and then automatically compared with the indices of the data of the indexed database 6. The order relation to one or several columns of the indexed database 6 is defined by the depicted pointers between the user input 5 and the indexed database 6.

When comparing the exemplary received user-input 5 with the data of the indexed database 6, the searching for similar indices is only executed for the exemplary restricted group of indices 30. Each single row is scanned for the received user-input 5 indices. The scanning of the indexed database 6 may be referred to as a table-scan. By executing the table-scan, an exemplary similarity-value 26 is determined for each row. The similarity-value 26 may be increasing, when more indices of the received user-input are identical to the database indices. Responsive on receiving the user-input 5, the data of the database may be ordered in an ascending manner. Hence, the control-diagrams with an increasing similarity to the received user input according to the algorithm may move upwards automatically.

The algorithm, which proposes the exemplary similar control-diagrams, can filter out same diagrams so that the user does not get anything proposed several times. In addition, the method of the present disclosure might start proposing similar control-diagrams only, when the number of fitting control-diagrams is a reasonable number, exemplary ten similar diagrams. Only when the user hits a predefined short-cut key, the whole list is displayed despite on the number of matched diagrams. Thus, the user will exemplary not get anything proposed in a too early stage where a similar control-diagram cannot be figured out.

The existing control-diagram 8 might be located either in some sort of library or repository or in a template-structure. For example, it could also be located in the project or application structure. As the projects pass on, the project structure may be filled more and more and thus the number of existing control-diagrams is growing. As ladder logic and function-block-diagrams may have the same capabilities, wherein the view is only different, the present disclosure could be also used for creating ladder logic diagrams.

Figure 7:
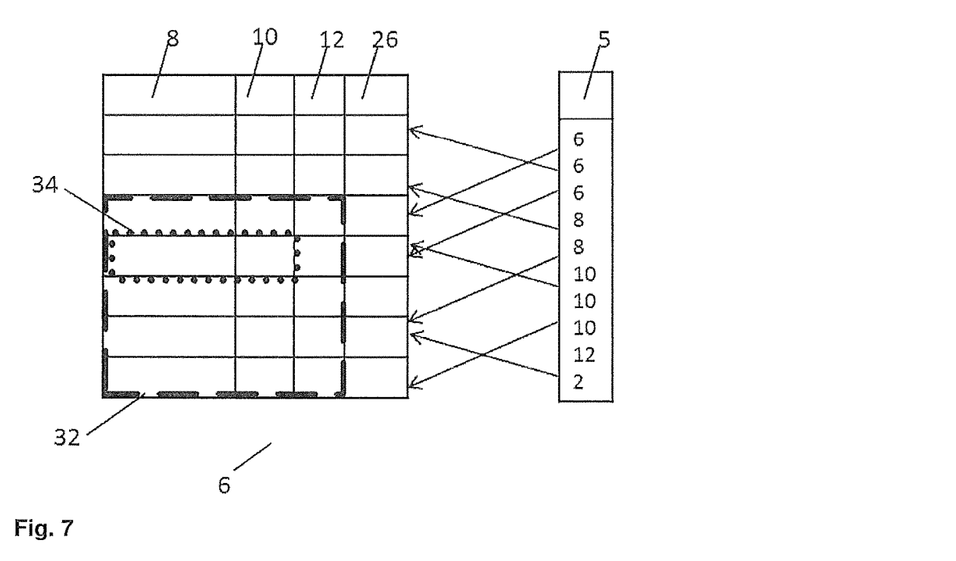
FIG. 7 is an exemplary scheme of an identical-effect group of an indexed database.

FIG. 7 depicts an exemplary identical-effect group 32 with preferred data 34 in an indexed database 6. The indexed database 6 contains, similar to FIG. 6, an exemplary existing control-diagram 8, an existing function-block 10, an existing function-block-connection 12, a similarity-value 26 and the user-input.

The identical-effect-group 32 contains a number of common naïve solutions to a technical problem and one preferred solution. The preferred solution is defined as the preferred data 34. The matching with the new diagram created by the user uses the identical-effect-group 32, the replacement will then be based on the preferred data 34. By this, the control logic can be slightly reduced, unnecessary complications could be minimized or common pitfalls are avoided. This results advantageously in a simplified and therefore better control code. Also it leads to a more consistent control code between different users.

Figure 8:
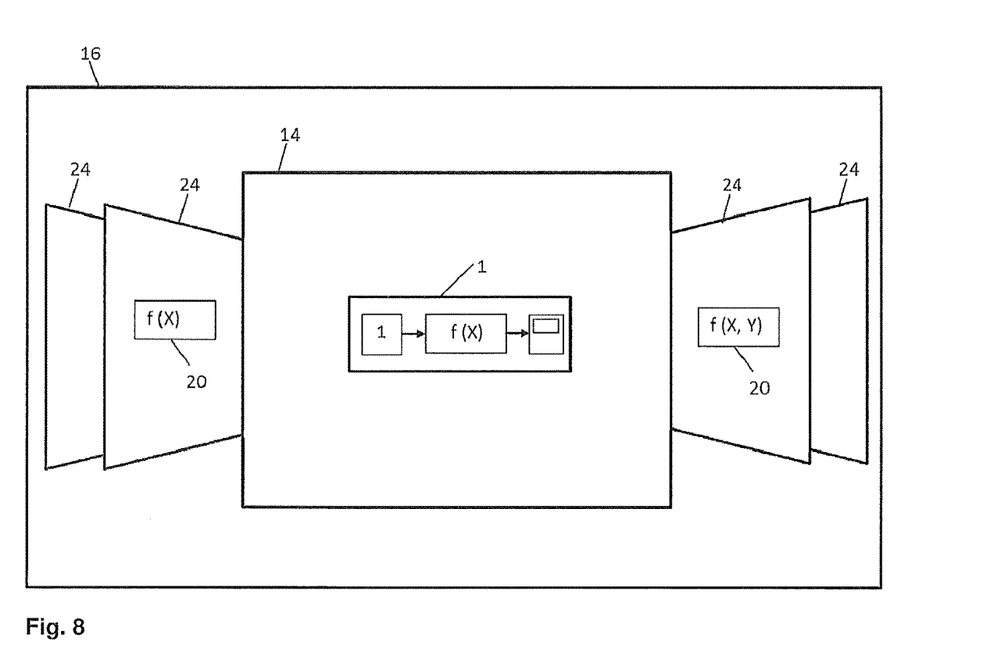
FIG. 8 is an exemplary display of a graphical-device.

FIG. 8 shows an exemplary display of an exemplary graphical device 16. The diagram-entry-field 14 and the assisting-menu 24 are exemplary displayed fan-shaped besides the graphical device 16. A new control-diagram 1 may be specified on the diagram-entry-field 14 and the identified similar function-block 20 may be displayed in a single assisting-menu 24 adjacent to the diagram-entry-field 14. Each assisting-menu 24 is, for example, an automatically opening window, which may be smaller than the diagram-entry-field 14. Furthermore, the user might be enabled to page through the different suggestions given in that window interactively, like in a book. The window could be also displayed in a separate section, wherein the separate section can be exemplary a list with small pictures giving a preview of the diagram.

According to an exemplary embodiment, the presentation of the proposed diagrams could be a very simple list with only the names of the similar control-diagrams in it. According to another exemplary embodiment, the preview of the similar control-diagrams appears only but is not in focus.

Advantageously, the user can continue working when he is not interested in the suggestions. After a certain time, it can disappear and then appear again after creating a function block or adding a new function-block-connection. As an exemplary alternative, a small icon-sized indicator pops up next to the last created function-block. When this indicator is exemplary clicked by the user, the graphical preview appears as assisting-menu.

While the present disclosure has been illustrated and described in detail in the drawings and foregoing description, such illustration and description are to be considered illustrative or exemplary and not restrictive; the present disclosure is not limited to the disclosed embodiments. Other variations to the disclosed embodiments can be understood and effected by those skilled in the art and practising the claimed disclosure, from a study of the drawings, the present disclosure, and the appended claims. In the claims, the word "comprising" or "including" does not exclude other elements or steps, and the indefinite article "a" or "an" does not exclude a plurality. A single processor or controller or other unit may fulfil the functions of several items recited in the claims. The mere fact that certain measures are recited in mutually different dependent claims does not indicate that a combination of these measures cannot be used to advantage.

It will therefore be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

LIST OF REFERENCES

Control-diagram 1
Function-block 2
Computer 3
Function-block-connection 4
User 5
Input-device 5a
User-input 5b
Indexed database 6
Existing control-diagram 8
Existing function-block 10
Existing function-block-connection 12
Diagram-entry-field 14
Graphical-device 16
Similar part of control-diagram 18
Similar function-block 20
Similar function-block-connection 22
Assisting-Menu 24
Similarity-Value 26
Not similar subpart 28
Restricted group of indices 30
Identical-effect-group 32
Preferred data 34

What is claimed is:

1. A computer-implemented method for generating control-code in which at least one processor of a computer is executing a computer program, wherein a control-diagram with at least one of a function-block and function-block-connection is specified, the method comprising:
providing an indexed database containing data of at least part of at least one existing control-diagram with function-blocks and function block-connections, wherein each control-diagram is a graphical representation of a functional flow of a system, each function-block is a graphical representation of an action within the functional flow, and each function block-connection is a graphical representation of a relationship between at least two function-blocks;
displaying, by the at least one processor, a diagram-entry-field on a graphical-device for specifying the control-diagram by defining the at least one of the function-block and the function block-connection via user input;
receiving, by the at least one processor, user input of the at least one of the function-block and the function block-connection;
comparing, by the at least one processor, responsive to the receiving, the received user input with the data of the indexed database to identify at least one similar part of the at least one control-diagram;
displaying, by the at least one processor, an assisting-menu on the graphical-device with the at least one similar part of the at least one control-diagram;
receiving, by the at least one processor, an acceptance or rejection of the at least one similar part of the at least one control-diagram via user input;
in case of acceptance, inserting, by the at least one processor, the at least one similar part of the at least one control-diagram from the indexed database in the diagram-entry-field; and
translating, by the at least one processor, the completed control-diagram in the control-code.

2. The method according to claim 1, comprising:
identifying a similarity of the at least one similar part of the at least one control-diagram by:
translating the received user input into indices according to a structure of the indexed database;
comparing, at least in part, the indices of the user-input with the indices of the data of the indexed database and filtering the compared data; and
determining the similarity according to the filtered data.

3. The method according to claim 2, comprising:
excluding from insertion at least one not similar subpart of the identified at least one similar part of the at least one control-diagram.

4. The method according to claim 2, wherein the indices of the user-input are only compared with a restricted group of indices of the indexed database.

5. The method according to claim 1, comprising:
excluding from insertion at least one not similar subpart of the identified at least one similar part of the at least one control-diagram.

6. The method according to claim 1, comprising:
determining a similarity-value for the at least one similar part of the at least one control-diagram and assigning the determined similarity-value thereto.

7. The method according to claim 6, wherein the similarity-value is determined such that it is increasing according to an increasing number of same values of indices of the user-input compared to the indices of the identified at least one similar part of the at least one control-diagram.

8. The method according to claim 7, wherein at least one of the indices of the user-input and the indices of the identified at least one similar part of the at least one control-diagram are weighted.

9. The method according to claim 8, wherein only at least one similar part of the at least one control-diagram with a similarity-value equal or higher than a minimum similarity-level is displayed.

10. The method according to claim 6, wherein only at least one similar part of the at least one control-diagram with a similarity-value equal or higher than a minimum similarity-level is displayed.

11. The method according to claim 1, comprising:
defining at least one identical-effect-group of at least parts of at least one existing control-diagram with identical technical effect;
determining for each identical-effect-group a preferred data, respectively a preferred solution;
in case of identifying at least one similar part of the at least one control-diagram in an identical-effect-group, displaying at least the respective preferred data.

12. The method according to claim 11, comprising:
displaying an option to select in between the identified several similar parts in case of identifying several similar parts of several control-diagrams.

13. The method according to claim 1, wherein the graphical-device is configured as a touch pad.

14. A non-transitory computer-readable recording medium having a computer program recorded thereon that causes at least one hardware processor of a computer processing device to execute a method of generating control-code, wherein a control-diagram with at least one of a function-block and function-block-connection is specified, the method comprising:
accessing an indexed database containing data of at least part of at least one existing control-diagram with function-blocks and function block-connections, wherein each control-diagram is a graphical representation of a functional flow of a system, each function-block is a graphical representation of an action within the functional flow, and each function block-connection is a graphical representation of a relationship between at least two function-blocks;
displaying a diagram-entry-field on a graphical-device for specifying the control-diagram by defining the at least one of the function-block and the function block-connection via user input;
receiving user input of the at least one of the function-block and the function block-connection;
comparing responsive to the receiving, the received user input with the data of the indexed database to identify at least one similar part of the at least one control-diagram;
displaying an assisting-menu on the graphical-device with the at least one similar part of the at least one control-diagram;
receiving an acceptance or rejection of the at least one similar part of the at least one control-diagram via user input;
in case of acceptance, inserting the at least one similar part of the at least one control-diagram from the indexed database in the diagram-entry-field; and
translating, by the at least one processor, the completed control-diagram in the control-code.

* * * * *